(12) United States Patent
Parris

(10) Patent No.: US 8,970,003 B2
(45) Date of Patent: Mar. 3, 2015

(54) EMBEDDED PASSIVE INTEGRATION

(75) Inventor: Michael Curtis Parris, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 793 days.

(21) Appl. No.: 13/194,754

(22) Filed: Jul. 29, 2011

(65) Prior Publication Data

US 2013/0027899 A1 Jan. 31, 2013

(51) Int. Cl.
*H01L 27/06* (2006.01)
*G11C 11/4074* (2006.01)

(52) U.S. Cl.
CPC .................................. *G11C 11/4074* (2013.01)
USPC ........... 257/533; 257/207; 257/777; 438/171; 438/190; 438/238

(58) Field of Classification Search
USPC ........... 257/207, 533, 777; 438/171, 190, 238
See application file for complete search history.

(56) References Cited

U.S. PATENT DOCUMENTS

| | | | | |
|---|---|---|---|---|
| 5,608,246 | A * | 3/1997 | Yeager et al. | 257/295 |
| 7,511,589 | B2 * | 3/2009 | Tarng | 331/117 R |
| 8,064,274 | B2 * | 11/2011 | Fisch et al. | 365/189.09 |
| 8,659,956 | B2 * | 2/2014 | Fisch et al. | 365/189.07 |
| 2001/0038278 | A1 * | 11/2001 | Corva et al. | 323/283 |
| 2002/0031032 | A1 * | 3/2002 | Ooishi | 365/226 |

* cited by examiner

*Primary Examiner* — Nicholas Tobergte

(57) ABSTRACT

System and method for embedded passive integration relating to a multi-chip packaged device. The packaged device includes a capacitance layer that is configured for electrical coupling to a power supply and to a reference power supply. Further, the capacitance layer is configured for filtering the power supply and providing a filtered power supply. A semiconductor layer including a logic device is configured for electrical coupling to the filtered power supply.

23 Claims, 19 Drawing Sheets

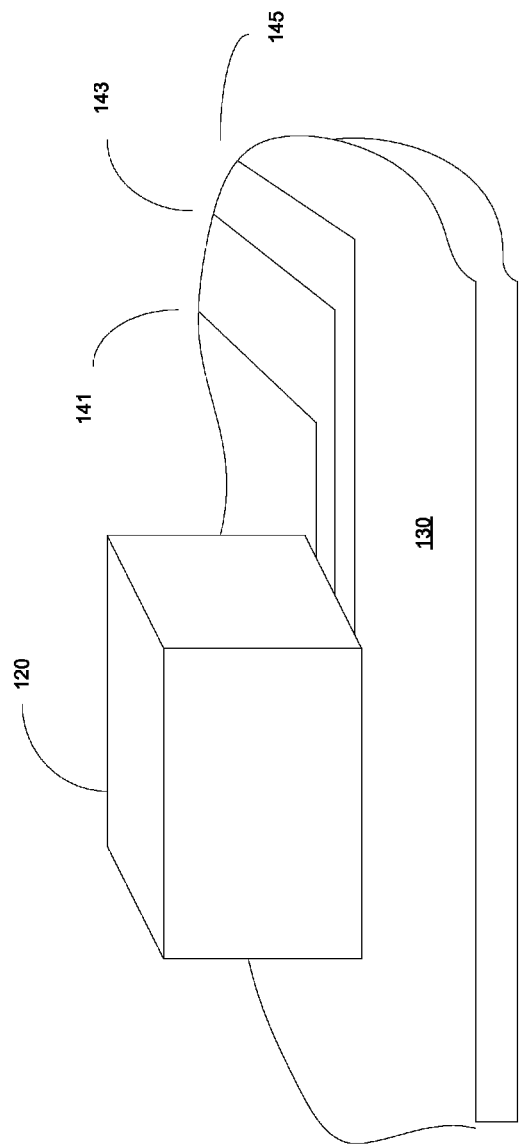

EMBEDDED PASSIVE INTEGRATION

BACKGROUND

Microelectronic devices have specific power and current demands, typically at low voltages and across a broad frequency range. A power distribution network is configured to distribute power and ground voltages to all devices in chip circuit and multi-chip package design. With the exhaustive search for improved scaling of microelectronic devices, power supply integrity has become a major concern that is enhanced as supply voltages continue to drop.

Shrinking device dimensions, increased current densities, and increased operating frequencies all have decreased the tolerance for voltage drop and noise. For instance, excessive voltage drops at the point at which power is accessed reduce tolerance for switching speeds and noise margins of a circuit. Additionally, the voltage drops may also inject unwanted noise and/or jitter into the power signal. As a result, voltage drop and unwanted noise in a power supply may lead to functional failures of the design circuit.

Capacitance between power and ground distribution networks help to filter the power supply. For instance, capacitance between power and ground distribution networks act to store charge location, which helps to mitigate the voltage drop and noise of the power supply at supply points. However, in circuit design, including package design, placement and location of the capacitance is very important. Previously, capacitance used to filter an external power supply has been located outside a packaged device. Locating the capacitance outside of the packaged device allows for placement of large capacitances for optimum filtering capabilities, but at a cost. Specifically, capacitance filtering outside of the package is characterized by increased trace lengths which again reduces the integrity of the power supply signal. Trace lengths may be reduced by locating the capacitance on a chip. However, on-chip power supply filtering takes up valuable chip real-estate, and is becomes more costly as the need for improved device scaling continues. As such, attention to power supply integrity is necessary to ensure reliable operation of circuits on a chip.

SUMMARY

Embodiments of the present invention generally relate to the filtering of power supplies available to a packaged device, wherein the filtering is accomplished through a capacitance layer available within the packaged device. In particular, one or more capacitors can be formed on a silicon chip to create a capacitance layer. By placing that capacitance layer between a power supply and a reference supply, a filter capacitance is formed. Further, placing the capacitance layer as close as possible to the active semiconductor devices, and more particularly within a semiconductor package, optimum power supply integrity may be achieved.

In one embodiment, a multi-chip packaged device includes a capacitance layer configured for electrical coupling to a power supply and to a reference power supply. The capacitance layer filters the power supply in order to provide a filtered power supply. The filtered power supply is available within the packaged device, such that a semiconductor layer including a logic device is configured for electrical coupling to the filtered power supply.

In another embodiment, a multi-chip packaged device includes a first pair of power supplies: a first power supply and a first reference power supply; and a second pair of power supplies: a second power supply and a second reference power supply. The packaged device also includes a capacitance layer comprising a plurality of portions of capacitance areas, each of which is electrically isolated from the other portions. In that manner, each portion is able to filter a different power supply. For instance, the capacitance layer includes a first portion of the capacitance layer that is electrically coupled to the first power supply and to the first reference power supply to provide a filtered first power supply. A first semiconductor layer including a logic device is electrically coupled to the filtered first power supply. Also, the packaged device includes a second portion of the capacitance layer that is electrically coupled to the second power supply and to the second reference power supply to provide a filtered second power supply, wherein the first semiconductor layer is electrically coupled to the filtered second power.

In still another embodiment, a method for packaging is disclosed, wherein the method includes forming a capacitance layer in a multi-chip packaged device that is configured for electrical coupling to a power supply and to a reference power supply. The capacitance layer is configured for filtering the power supply and providing a filtered power supply. The method also includes forming a semiconductor layer including a logic device in the packaged device, wherein the semiconductor layer is configured for electrical coupling to the filtered power supply.

These and other objects and advantages of the various embodiments of the present disclosure will be recognized by those of ordinary skill in the art after reading the following detailed description of the embodiments that are illustrated in the various drawing figures.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

FIG. 1B is a perspective view of a multi-chip packaged device placed on a printed circuit board having various power supplies available to the multi-chip packaged device, in accordance with one embodiment of the present disclosure.

PRIOR ART

DETAILED DESCRIPTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Accordingly, embodiments of the present disclosure illustrate a packaged device that includes a capacitance layer that is configured to filter a power supply that is then made available to the other chips in the packaged device. In that manner, optimum power supply integrity is achieved. For instance, voltage drop and noise of the power supply signal is minimized.

Embodiments of the present invention are disclosed within the context of multi-chip stacked devices, in which multiple chips are stacked on top of each other in various configurations within a single semiconductor package. In particular, embodiments of the present invention are directed to the filtering of power supplies available within a single semiconductor package that include memory devices, located on one or more chips, and a logic chip (e.g., memory controller, microprocessor, etc.) for controlling those memory devices. However, other embodiments of the present invention provide for the filtering of power supplies available to a semiconductor package that includes chips of varying functions or technology, such as logic, analog, mixed-signal processing, etc., and not those used solely for memory stacking As such, embodiments of the present invention are able to provide highly stable power supplies that are available to any packaged device that has need for stable power supplies.

Figure 1A:
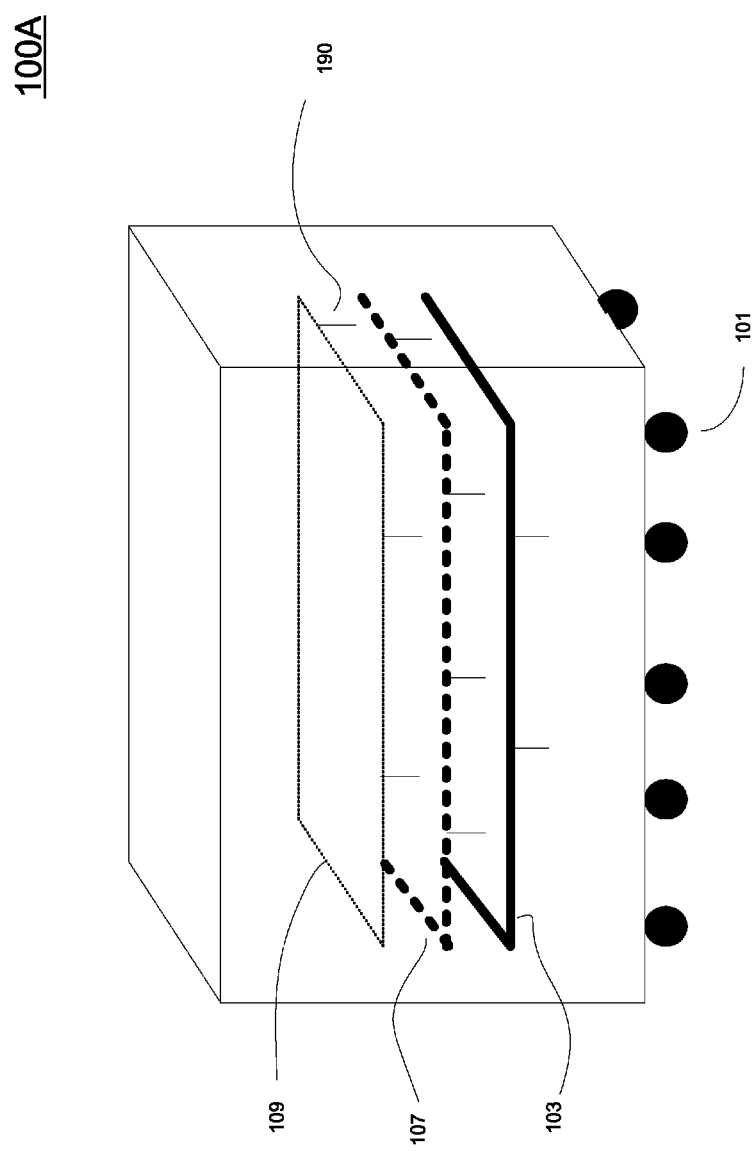
FIG. 1A is a perspective view of a multi-chip packaged device including a capacitance layer for filtering a power supply, in accordance with one embodiment of the present disclosure.

FIG. 1A is a perspective view of a multi-chip packaged device 100A including a capacitance layer 107 for filtering a power supply, in accordance with one embodiment of the present disclosure. The capacitance layer is configured for electrical coupling to a power supply (not shown) and to a reference power supply (not shown). In embodiments, the power supply is an external or an internal power supply.

In particular, the capacitance layer 107 is configured to receive a power supply or power supply signal, filter that power supply signal and then provide a filtered power supply or power supply signal that is available to the other chips in the packaged device 100A. For instance, the filtered power supply is made available to a first semiconductor layer 103 that includes a logic device, such as a memory controller, microprocessor, etc. As such, the first semiconductor layer is configured for electrical coupling to the filtered power supply, such as within the packaged device 100A.

In one embodiment, the packaged device includes one or more memory chips stacked in various configurations with the capacitance layer 107 and the logic chip 103. As shown, a second semiconductor layer 109 that includes a memory is electrically coupled to the capacitance first semiconductor layer, which includes the logic device. In that manner, the logic chip is able to control access (e.g., read, write, etc.) to the memory cells available within the second semiconductor layer 109.

As shown in FIG. 1A, each of the layers in the packaged device 100A are interconnected using through silicon vias (TSVs) (e.g., TSV 190), in one embodiment. In that manner, a memory cell in the second semiconductor layer 109 is electrically coupled to the first semiconductor layer 103 through an intervening capacitance layer 107 for purposes of access and control of that memory cell. In another embodiment, layers are interconnected using wirebonding or any other suitable means for connection.

Additionally, one or more layers in the packaged device 100A are also electrically coupled to conductive elements external to the packaged device 100A. For instance, as shown in FIG. 1A, one or more solder balls 101 are shown that are configured in a ball grid array. Traces that are internal to the packaged device 100A and leading to one or more components on the layers 103, 107, and 109 may be connected to the solder balls 101 for purposes of electrical coupling to devices and/or components external to the packaged device 100A. Though a ball grid array is shown in FIG. 1A, any suitable types of bonding are supported for use with embodiments of the present invention, such as wire bonding, or flip chip assembly, etc.

FIG. 1B is a perspective view of a multi-chip packaged device 120 placed on a printed circuit board (PCB) 130, in accordance with one embodiment of the invention. In particular, the PCB is configured to provide various external power supplies to the packaged device 120. These power supplies are accessed through respective traces 141, 143, and 145, that are each electrically coupled to a generated power supply signal. In that manner, each of the traces 141, 143, and 145 provide a respective power supply and/or power supply signal. For instance, a power supply signal may be made available through one or more solder balls that are connected to internal traces electrically coupled to one or more layers (e.g., semiconductor layers, capacitance layers, etc.) located within the packaged device 120.

FIGS. 2A-D are cross-sectional views of multi-chip packaged devices showing the various locations of a capacitance layer in relation to a semiconductor layer that includes a logic device, in accordance with embodiments of the present disclosure. For optimum delivery of one or more power supplies to a specific layer within a packaged device, the relational locations of the two layers is of critical importance. In one embodiment, the capacitance layer providing a filtered power supply is located adjacent to the semiconductor layer receiving the filtered power supply. In that manner, by reducing the routing of interconnections between layers results in faster signal propagation, reduced noise and voltage drop, all of which helps maintain the integrity of the power supply. In other embodiments, the capacitance layer is located remote from the layer receiving the filtered power supply. Additionally, embodiments of the present invention are suitable for providing one or more filtered power supplies to capacitance layers, and semiconductor layers, including logic and memory devices, in a packaged device of varying layer configurations. That is, embodiments of the present invention support all layer configurations in the packaged device.

Figure 2A:
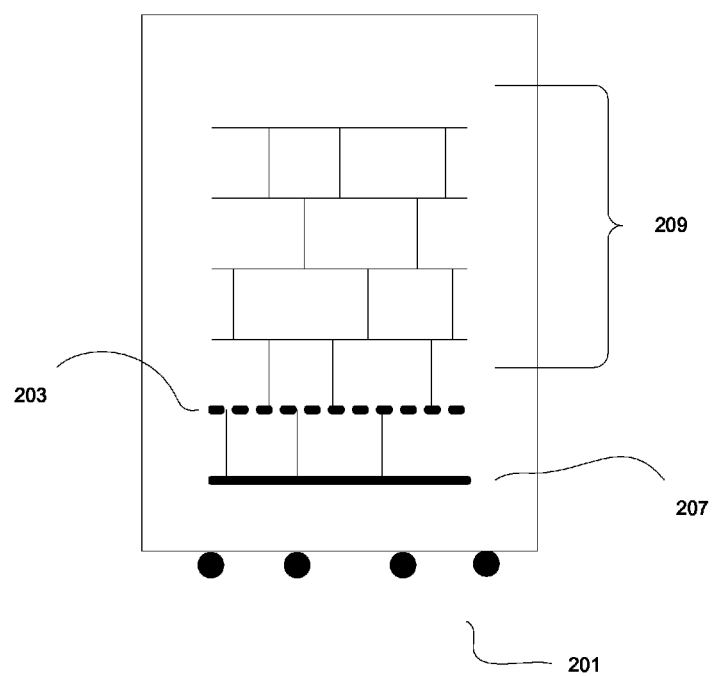
FIGS. 2A-D are cross-sectional views of multi-chip packaged devices showing the various locations of a capacitance layer in relation to a semiconductor layer that includes a logic device, in accordance with embodiments of the present disclosure.

FIG. 2A is a cross-sectional view of a multi-chip packaged device 200A that includes a capacitance layer 203 for filtering a power supply, in accordance with one embodiment of the invention. The capacitance layer 203 is configured for electrical coupling to a power supply (not shown), and in some configurations to a reference power supply (not shown). In embodiments, the power supplies are external and/or internal power supplies. For instance, in the case of an external power supply, the capacitance layer 203 may be electrically coupled to a power supply through a solder ball in the ball grid array 201.

As shown in FIG. 2A, the capacitance layer 203 is formed adjacent to the semiconductor layer 207 that includes a logic device. The requirements of the logic device demand that the power supply be stable when delivered, such that its integrity is maintained. As such, the capacitance layer 203 is configured to provide a filtered power supply to the semiconductor layer 207. Further, one or more additional semiconductor layers 209, such as those of a memory device are located above the capacitance layer 203 and layer 207 that includes the logic device. In one embodiment, a layer 209 includes one or more DRAM cells. In another embodiment, a layer 209 includes one or more flash memory cells. The capacitance layer 203 is also configurable to provide the filtered power supply to one or more semiconductor layers 209. Specifically, the semiconductor layer 207 is located at the bottom of the stack of chips in the packaged device 200A, and the capacitance layer 203 is located immediately above the semiconductor layer 207. By locating the capacitance layer 203 adjacent to layer 207 including the logic device, optimum power supply integrity is provided when delivering power to layer 207. For instance, minimal degradation of the power supply is achieved while delivering the power supply to layer 207 that includes the logic device.

Figure 2B:
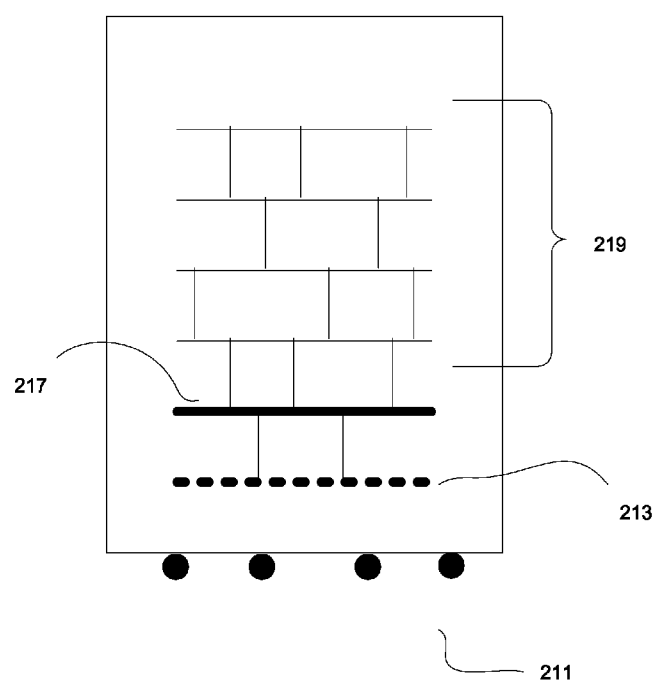

FIG. 2B is a cross-sectional view of a multi-chip packaged device 200B that includes a capacitance layer 213 for filtering a power supply, in accordance with one embodiment of the invention. The capacitance layer 213 is configured for electrical coupling to a power supply (not shown), and in some configurations to a reference power supply (not shown), both of which are available internally or externally to the packaged device 200B. For instance, in the case of an external power supply, the capacitance layer 213 may be electrically coupled to a power supply through a solder ball in the ball grid array 211.

As shown in FIG. 2B, the capacitance layer 213 is formed adjacent to the semiconductor layer 217 that includes a logic device. The requirements of the logic device demand that the power supply be stable when delivered, such that its integrity is maintained. As such, the capacitance layer 213 is configured to provide a filtered power supply to the semiconductor layer 217. Further, one or more additional semiconductor layers 219, such as those of a memory device are located above the capacitance layer 213 and layer 217 that includes the logic device. The capacitance layer 213 is also configurable to provide the filtered power supply to one or more semiconductor layers 219. Specifically, capacitance layer 213 is located at the bottom of the stack of chips in the packaged device 200B. The semiconductor layer 217 that includes the logic device is located immediately above the capacitance layer 213. By locating the capacitance layer 213 adjacent to layer 217 including the logic device, optimum power supply integrity is provided when delivering power to layer 217, such as minimal degradation of the power supply.

Figure 2C:
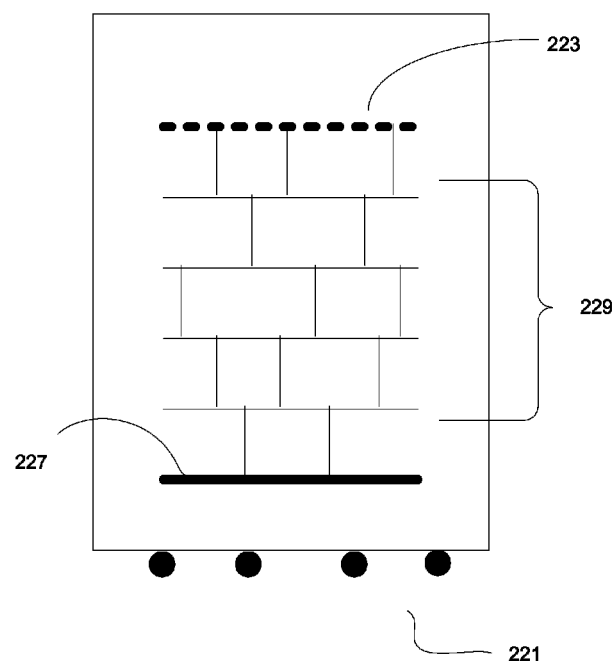

FIG. 2C is a cross-sectional view of a multi-chip packaged device 200C that includes a capacitance layer 223 for filtering a power supply, in accordance with one embodiment of the invention. The capacitance layer 223 is configured for electrical coupling to a power supply (not shown), and in some configurations to a reference power supply (not shown), both of which are available internally or externally to the packaged device 200C. For instance, in the case of an external power supply, the capacitance layer 223 may be electrically coupled to a power supply through a solder ball in the ball grid array 221.

As shown in FIG. 2C, the capacitance layer 223 is formed over the semiconductor layer 227 that includes a logic device. The requirements of the logic device demand that the power supply be stable when delivered, such that its integrity is maintained. As such, the capacitance layer 223 is configured to provide a filtered power supply to the layer 227. In particular, the semiconductor layer 227 that includes the logic device is located at the bottom of the stack of chips in the packaged device 200C, and the capacitance layer 223 is located at the top of the stack. Further, one or more additional semiconductor layers 229, such as those of a memory device are located between the capacitance layer 223 and layer 227 that includes the logic device. Capacitance layer 223 is also configurable to provide the filtered power supply to semiconductor layers 229. Package design may require that the capacitance layer 223 be remote from layer 227 that includes the logic device.

Figure 2D:
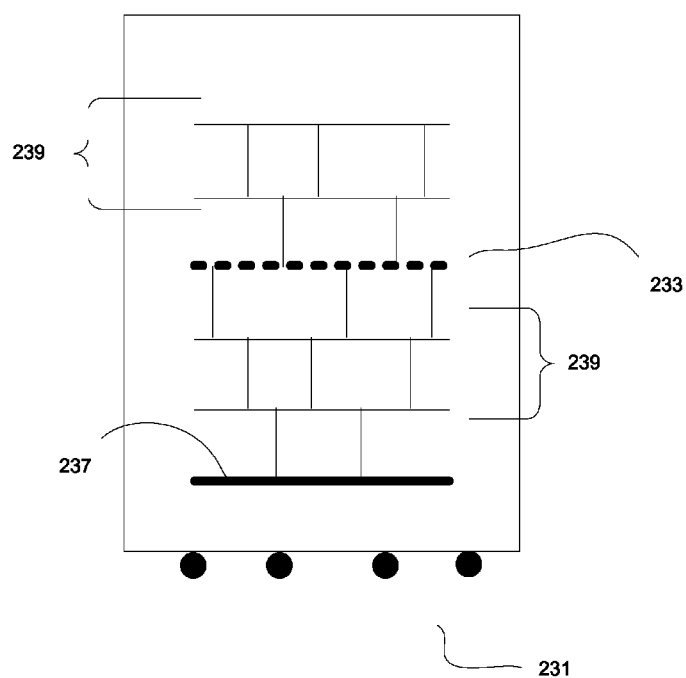

FIG. 2D is a cross-sectional view of a multi-chip packaged device 200D that includes a capacitance layer 233 for filtering a power supply, in accordance with one embodiment of the invention. The capacitance layer 233 is configured for electrical coupling to a power supply (not shown), and in some configurations to a reference power supply (not shown), both of which are available internally or externally to the packaged device 200D. For instance, in the case of an external power supply, the capacitance layer 233 may be electrically coupled to a power supply through a solder ball in the ball grid array 231.

As shown in FIG. 2D, the capacitance layer 233 is formed over the semiconductor layer 237 that includes a logic device. The requirements of the logic device demand that the power supply be stable when delivered, such that its integrity is maintained. As such, the capacitance layer 233 is configured to provide a filtered power supply to the layers in the packaged device 200D. In particular, the semiconductor layer 237 that includes the logic device is located at the bottom of the stack of chips in the packaged device 200D, and the capacitance layer 233 is located above semiconductor layer 237.

Further, one or more additional semiconductor layers 239, such as those of a memory device are located in the packaged device, such that they surround the capacitance layer 233. Package design may require that the capacitance layer 233 be remote from layer 227 that includes the logic device. For instance, the central location of the capacitance layer 233 may be designed to provide the stable power supply across each of the layers in the packaged device 200D, instead of targeting one layer.

In still another embodiment, another capacitance layer is included in the packaged device. The second capacitance layer may be electrically coupled to another power supply available to the packaged device. In that manner, each capacitance layer is able to provide a different filtered power supply to the packaged device. In still another embodiment, a single capacitance layer is divided into separate portions, each of which is electrically isolated to provide one or more filtered power supplies, as will be described more fully in relation to FIG. 4 below.

Figure 3:
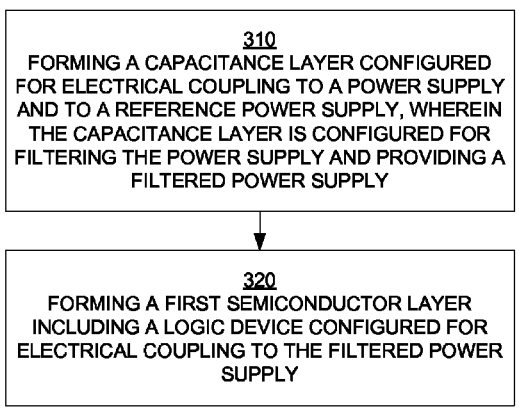
FIG. 3 is a flow chart of a method for fabricating a multi-chip packaged device including a capacitance layer for filtering a power supply, in accordance with one embodiment of the present disclosure.

FIG. 3 is a flow chart 300 of a process used for filtering a power supply available to a multi-chip packaged device. This is achieved through the formation of an in-package capacitance layer for filtering purposes, such that the integrity of the filtered power supply is maintained. For instance, the delivered filtered power supply available to the packaged device at various supply points has reduced noise and voltage drop.

At 310, a capacitance layer is formed within a multi-chip stack and is configured for electrical coupling to a power supply and to a reference power supply, both of which are available internally or externally to the packaged device. In particular, the capacitance layer is configured to receive the power supply, filter that power supply, and then provide a filtered power supply to the chips in the packaged device.

For instance, at 320 a first semiconductor layer is also formed in the packaged device. The semiconductor layer may include any device, such as a logic device. For instance, the logic device may be a memory controller, or a microprocessor. As such, the first semiconductor layer is configurable for electrical coupling to the filtered power supply within the packaged device, such that the filtered power supply is made available to the first semiconductor layer.

Further, a second semiconductor layer that includes a memory device may also be formed in the package device. For instance, the packaged device may include one or more memory chips stacked in various formation configurations with the capacitance layer and the semiconductor layer including the logic device. The logic device is configurable to provide access and control over the stacked memory chips in the packaged device.

In one embodiment, the second semiconductor layer including the memory device is formed over the capacitance layer, such that the capacitance layer is between the first semiconductor layer including the logic device and the second semiconductor layer including the memory device. In another embodiment, the second semiconductor layer including the memory device is formed over the capacitance layer such that the first semiconductor layer including the logic device is formed between the capacitance layer and the second layer including the memory device. In still another embodiment, the second semiconductor layer including the memory device is formed over the capacitance layer such that that the second semiconductor layer is formed between the capacitance layer and the first semiconductor layer including the logic device. Other layer configurations are contemplated, such as forming the semiconductor layer including the memory device below the capacitance layer and/or the logic device layer.

In one embodiment, the capacitance layer is formed adjacent the first semiconductor layer including the logic device. In that manner, noise and voltage drop, as well as other negative characteristics, are reduced when providing the filtered power supply to the first semiconductor layer. In another embodiment, the capacitance layer is formed remote from the first semiconductor layer. That is, one or more second semiconductor layers including memory devise may be formed between the first semiconductor layer and the capacitance layer.

The capacitance layer may be formed using various techniques. In general, the capacitance layer is formed using one or more capacitor cells coupled together. In one embodiment, the capacitance layer is a semiconductor layer that includes an array of DRAM configured cells. In another embodiment, the capacitance layer includes one or more ceramic capacitors. In one embodiment, the capacitor (e.g., DRAM) configured cells are configured for electrical coupling in parallel to the power supply and/or the reference power supply, as will be further described below. In another embodiment, the capacitor (e.g., DRAM) configured cells are configured for electrical coupling in series to the power supply and/or the reference power supply, as will be further described below.

Figure 4:
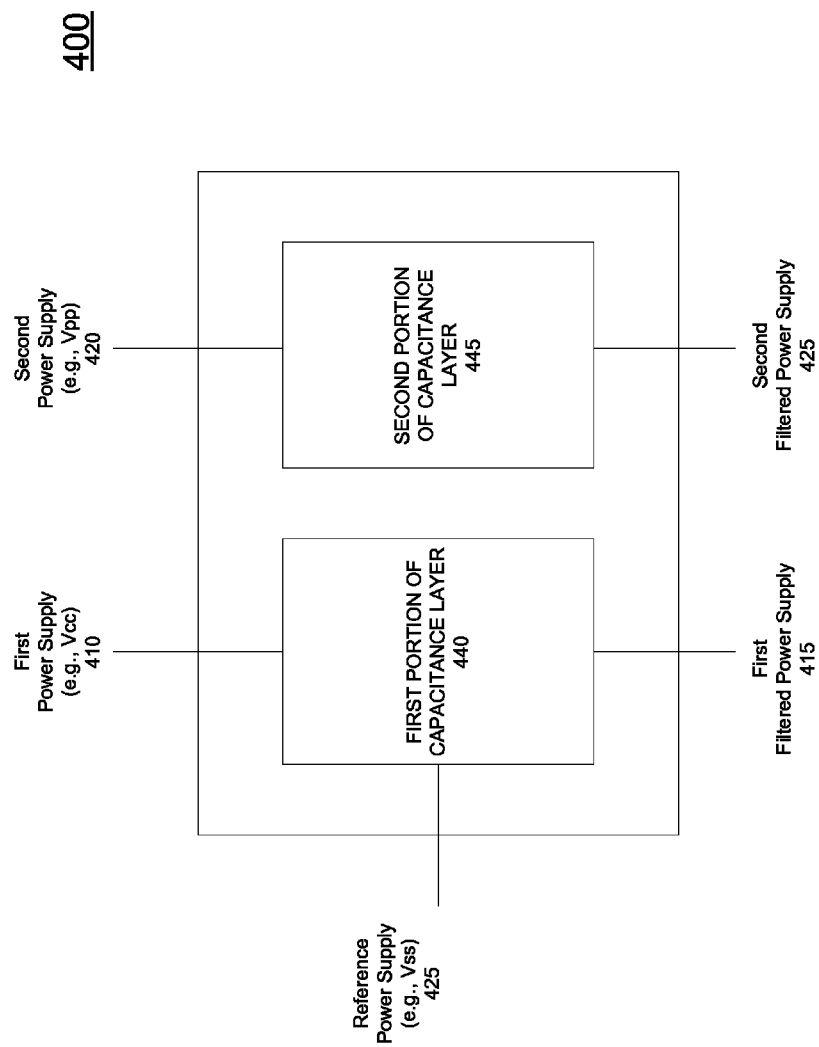
FIG. 4 is an illustration of a capacitance layer comprising one or more portions that are electrically isolated and are configurable to filter power supplies, in accordance with one embodiment of the present disclosure.

FIG. 4 is an illustration of a capacitance layer 400 comprising one or more portions that are electrically isolated and are configurable to filter one or more power supplies, in accordance with one embodiment of the present disclosure. Each portion of the capacitance layer 400 includes one or more capacitance cells coupled together.

As shown in FIG. 4, the capacitance layer 400 is divided into two portions, for purposes of illustration only. The capacitance layer 400 may be divided into two or more portions in various embodiments. For instance, capacitance layer 400 includes first portion 440 and a second portion 445, each of which are electrically isolated from each other. As such, each portion provides a certain capacitance value used for purposes of filtering a respective power supply.

As shown, the first portion 440 is electrically coupled to a first power supply 410. In addition, the first portion 440 is electrically coupled to a reference power supply 425. As such, the first portion 440 of the capacitance layer 400 is able to provide a first filtered power supply 415 to each of the chips in a multi-chip package. The quality (e.g., overall stability and integrity) of the first filtered power supply is partly dependent on the first capacitance value of the first portion. In one embodiment, the larger the capacitance, the better quality of the filtered power supply.

In addition, the second portion 445 is electrically coupled to a second power supply 420. In one implementation, the power supplies 410 and 420 are different. For instance, the first power supply 410 may be Vcc, and the second power supply 420 may be Vpp, both of which are available to the packaged device. In addition, the second portion 445 is electrically coupled to a reference power supply 435. In one embodiment, the reference power supply 435 is similar to reference power supply 425. As such, the second portion 445 of the capacitance layer 400 is able to provide a second filtered power supply 425 to each of the chips in a multi-chip package. The quality (e.g., overall stability and integrity) of the second filtered power supply 425 is partly dependent on the capacitance value of the second portion. In one embodiment, the larger the capacitance, the better quality (e.g., overall stability and integrity) of the filtered power supply.

In one embodiment, the capacitance layer includes a plurality of DRAM configured cells. Specifically, an array of DRAM cells is configured to provide a large capacitance for purposes of power supply filtering. In one embodiment, the array of DRAM cells is made using state of the art DRAM fabrication technology. As an example, if the capacitance layer is formed in current state of the art DRAM technology, such as, 30 nm, 6 F², then a capacitance value of 3.7 pF/µm² is potentially achievable. Even with 50 percent efficiency, this give a capacitance value of 1.85 pF/µm². Advantageously, in other embodiments, the array of DRAM cells could be made using trenched or stacked capacitors technology that are utilized in existing or older fabrication factories. As such, with slight changes to the fabrication process, an array of DRAM cells used for capacitance filtering is generated on a silicon chip. Additionally, discarded chips, or outdated chips may be reconfigured for capacitance filtering within the context of embodiments of the present invention. As an example, if the capacitance layer is formed using older DRAM technology, such as, 60 nm technology, a capacitance value of 46 µF/cm² is achievable. The sophistication of the technology used for fabrication will determine the density of the array of DRAM cells, and correspondingly the amount of capacitance used for filtering.

Figure 5:
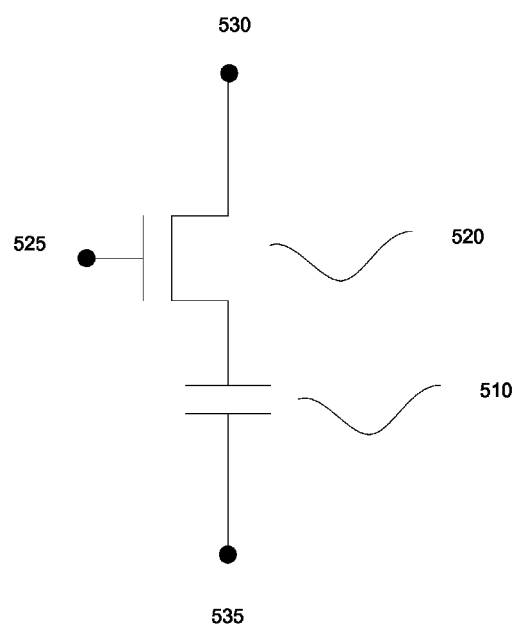
FIG. 5 is a circuit diagram of a dynamic random access memory (DRAM) cell including a pair of devices providing capacitance, and including a metal oxide semiconductor field effect transistor (MOSFET) and capacitor.

PRIOR ART FIG. 5 is a circuit diagram of a dynamic random access memory (DRAM) cell 500 including a pair of devices providing capacitance, in accordance with one embodiment of the invention. The DRAM cell 500 includes a metal oxide semiconductor field effect transistor (MOSFET) 520 and capacitor 510 configuration. As shown, the drain of a MOSFET 520 is coupled to a capacitor cell 535. Nodes 530 and 535 are coupled to power supplies, reference power supplies, and/or ground reference supplies depending on the configuration. As shown, nodes 525, 530, and 535 are easily accessible for filtering purposes.

Figure 6:
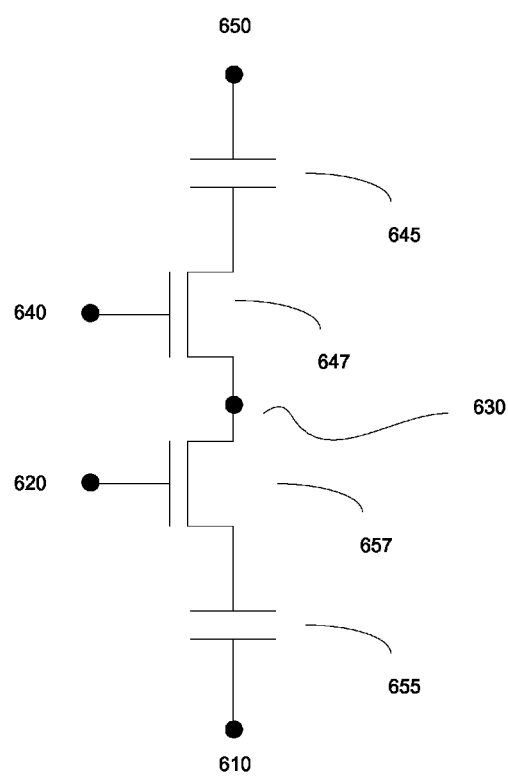
FIG. 6 is a diagram of a circuit including a pair of DRAM cells providing capacitance that illustrates the supply points for accessing the circuit, in accordance with one embodiment of the invention.

FIG. 6 is a diagram of a circuit 600 including a pair of DRAM cells providing capacitance, in accordance with one embodiment of the invention. Circuit 600 is provided to illustrate the supply points used for accessing filtered power supplies. For instance, one pair of DRAM cells includes a MOSFET 647 and a capacitor cell 645. A second pair of DRAM cells includes MOSFET 657 and capacitor 655. The pairs of DRAM cells can be coupled in series or in parallel. As shown, nodes 610, 620, 630, 640 and 650 are available for coupling to power supplies, reference power supplies, and/or ground reference. In addition, nodes 610, 630 and 650 may be accessed to provide a filtered power supply. For instance, node 650 may be coupled to a power supply, and also accessed to provide a filtered power supply.

FIGS. 7A-E are circuit diagrams of various DRAM cells configured to provide capacitance for purposes of power supply filtering, in accordance with embodiments of the invention. In general, in each of the circuits disclosed in FIGS. 7A-E, a DRAM cell configuration is wired to a power supply and/or a reference power supply. For instance, the DRAM cell may be wired between a power supply and reference power supply in order to form a capacitance filter. These cell configurations illustrated in FIGS. 7A-E may be coupled together to present a large capacitance used for power supply filtering. For instance, in one embodiment, the DRAM cell configurations are coupled in parallel, and in another embodiment, the DRAM cell configurations are coupled in series.

In the various circuit configurations of FIGS. 7A-E, the power supplies are listed as follows: $V_{BB}$ (below ground back bias), $V_{PP}$ (which is boosted above $V_{CC}$), $V_{CC}$ (external power supply), $V_{INT}$ (internal power supply), $V_{BLH}$ (bit line high level voltage), $V_{PL}$ (plate line voltage, which is approximately one half of $V_{BLH}$), $V_{BLPC}$ (bit line pre charge, which is approximately one half of $V_{BLH}$), $V_{SS}$ (reference power supply), and ground. These voltages are provided as examples, and embodiments of the present invention are able to provide filtering for any available voltage.

Figure 7C:
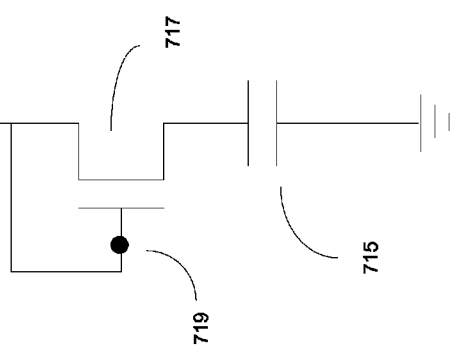
FIGS. 7A-E are circuit diagrams of various DRAM cells configured to provide capacitance for purposes of power supply filtering, in accordance with embodiments of the invention.
Figure 7B:
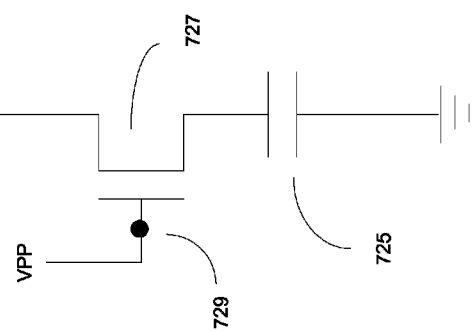
Figure 7A:
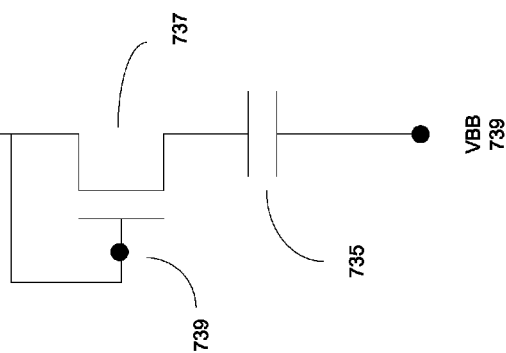

FIG. 7A is a circuit 700A that includes a MOSFET 717 coupled to a capacitor 715. Specifically, the source of the MOSFET 717 is coupled to a node 710, which is coupled to a power supply (e.g., $V_{BLH}$, $V_{INT}$, $V_{PP}$, or $V_{CC}$). Node 710 may also be accessed for the filtered power supply. Node 719 is coupled to the gate of the MOSFET 717, and also to node 710 in a feedback circuit. The drain of MOSFET 717 is coupled to capacitor 715, which is also coupled to ground FIG. 7B is a circuit 700B that includes a MOSFET 727 coupled to a capacitor 725. Specifically, the source of MOSFET 727 is coupled to a node 720, which is coupled to a power supply (e.g., $V_{BLH}$). Node 720 may also be accessed for the filtered power supply. Node 729 is coupled to the gate of the MOSFET 727, and is coupled to power supply $V_{PP}$. The drain of MOSET 727 is coupled the capacitor 725, which is also coupled to ground.

Figures 7D, 7E:
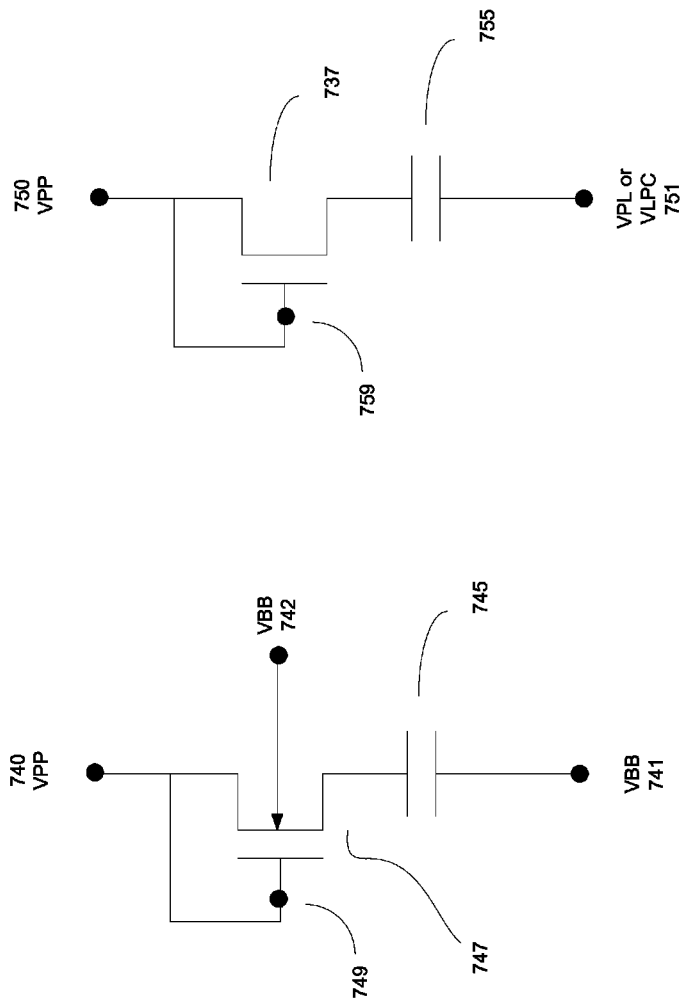

FIG. 7C is a circuit 700C that includes a MOSFET 737 coupled to a capacitor 735. Specifically, the source of the MOSFET 737 is coupled to a node 730, which is coupled to a power supply (e.g., $V_{INT}$ or $V_{CC}$). Node 730 may also be accessed for the filtered power supply. Node 739 is coupled to the gate of the MOSFET 737, and also to node 730 in a feedback circuit. The drain of MOSFET 737 is coupled to capacitor 735, which is also coupled to ground FIG. 7D is a circuit 700D that includes a MOSFET 747 coupled to a capacitor 745. Specifically, the source of the MOSFET 747 is coupled to a node 740, which is coupled to a power supply (e.g., $V_{PP}$). Node 740 may also be accessed for the filtered power supply. Node 749 is coupled to the gate of the MOSFET 747, and also to node 740 in a feedback circuit. The MOSFET 747 may also be coupled to a back bias voltage (e.g., $V_{BB}$). The drain of MOSFET 747 is coupled to capacitor 745, which is also coupled to $V_{BB}$.

FIG. 7D is a circuit 700E that includes a MOSFET 757 coupled to a capacitor 755. Specifically, the source of the MOSFET 757 is coupled to a node 750, which is coupled to a power supply (e.g., $V_{PP}$). Node 750 may also be accessed for the filtered power supply. Node 759 is coupled to the gate of the MOSFET 757, and also to node 750 in a feedback circuit. The drain of MOSFET 757 is coupled to capacitor 755, which is also coupled to another power supply (e.g., $V_{PL}$ or $V_{LPC}$).

Figure 8A:
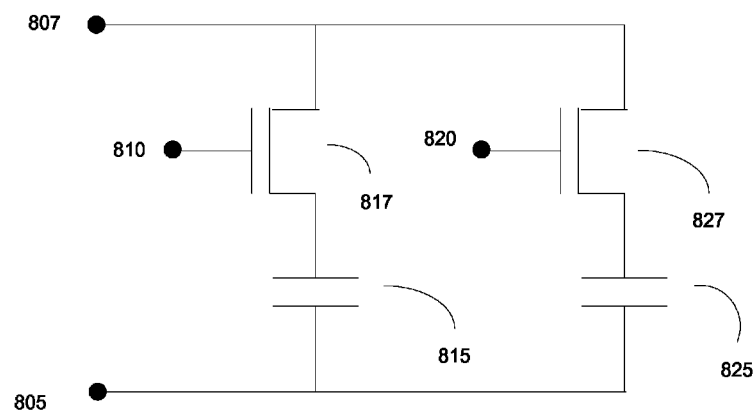
FIGS. 8A-C are diagrams of various circuits including DRAM cells coupled in parallel and configured to provide capacitance for purposes of power supply filtering, in accordance with embodiments of the invention.
Figure 8B:
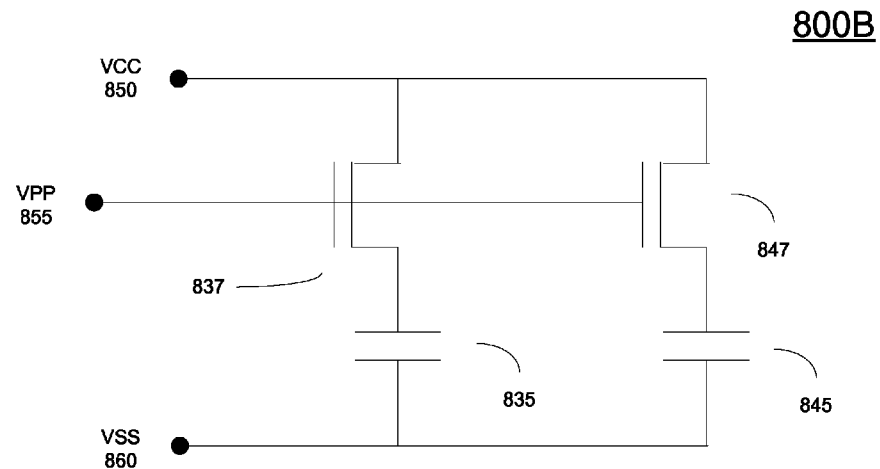
Figure 8C:
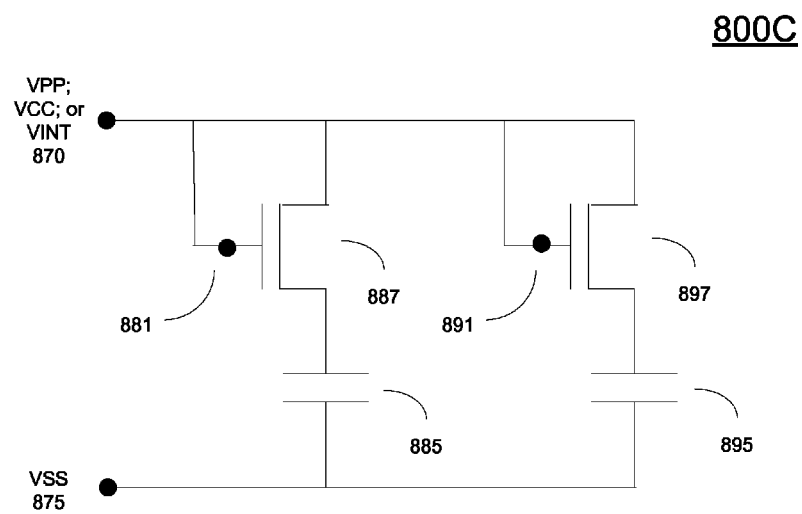

FIGS. 8A-C are diagrams of various circuits including DRAM cells coupled in parallel and configured to provide capacitance for purposes of power supply filtering, in accordance with embodiments of the invention. In general, in each of the circuits disclosed in FIGS. 8A-C, a DRAM cell configuration is wired to a power supply and/or a reference power supply. For instance, the DRAM cell may be wired between a power supply and reference power supply in order to form a capacitance filter. These cell configurations illustrated in FIGS. 8A-C are coupled together in parallel to provide a large capacitance used for power supply filtering.

FIG. 8A is a basic circuit 800A that includes a pair of DRAM cell configurations, in accordance with one embodiment of the invention. The design of circuit 800A is such due to the shared bit line contact nature of a particular array of DRAM configured cells. Each DRAM cell configuration includes a MOSFET that is coupled to a capacitor. More particularly, a pair of DRAM cell configurations is coupled across node 805 and node 807. For instance, in the first DRAM cell configuration, the source of MOSFET 817 is coupled to a node 807. The gate of MOSFET 817 is coupled to node 810. The drain of MOSFET 817 is coupled to a capacitor 815, which is also coupled to node 805. In addition, in the second DRAM cell configuration, the source of MOS- FET 827 is coupled to node 807. The gate of MOSFET 827 is coupled to node 820. In addition, the drain of MSOFET 827 is coupled to capacitor 825, which is also coupled to node 805. By coupling the various nodes 805, 807, 810, and 820 to various power supplies and/or to ground, as is shown in FIGS. 8B and 8C, a capacitance circuit is configurable as a capacitance filter to provide a filtered power supply.

FIG. 8B is a circuit 800B that includes a pair of DRAM cell configurations, in accordance with one embodiment of the invention. In particular, a pair of DRAM cell configurations is coupled across nodes 850 and 860. For instance, in the first DRAM cell configuration, the source of MOSFET 837 is coupled to node 850, which is coupled to a power supply (e.g., $V_{CC}$). Node 850 may also be accessed for the filtered power supply. The gate of MOSFET 837 is coupled to node 855, which is coupled to a power supply (e.g., $V_{PP}$). The drain of MOSFET 837 is coupled to a capacitor 835, which is also coupled to node 860, which is coupled to a reference power supply (e.g., $V_{SS}$). In addition, in the second DRAM cell configuration of FIG. 8B, the source of MOSFET 847 is coupled to node 850, which is coupled to a power supply (e.g., $V_{CC}$). The gate of MOSFET 847 is coupled to the gate of MOSFET 837, which is coupled to a power supply (e.g., $V_{PP}$). The drain of MOSFET 847 is coupled to capacitor 845, which is also coupled to node 860, which is coupled to a reference power supply (e.g., $V_{SS}$).

FIG. 8C is a circuit 800C that includes a pair of DRAM cell configurations, in accordance with one embodiment of the invention. In particular, a pair of DRAM cell configurations is coupled across nodes 870 and 875. For instance, in the first DRAM cell configuration, the source of MOSFET 887 is coupled to node 870, which is coupled to a power supply (e.g., $V_{PP}$, $V_{CC}$, or $V_{INT}$). Node 870 may also be accessed for the filtered power supply. The gate of MOSFET 887 is coupled to node 881, which is also coupled to node 870 in a feedback circuit. The drain of MOSFET 887 is coupled to a capacitor 885, which is also coupled to node 875, which is coupled to a reference power supply (e.g., $V_{SS}$). In addition, in the second DRAM cell configuration of FIG. 8C, the source of MOSFET 897 is coupled to node 870, which is coupled to a power supply (e.g., $V_{PP}$, $V_{CC}$, or $V_{INT}$). The gate of MOSFET 897 is coupled to node 891, which is also coupled to node 870 in a feedback circuit. The drain of MOSFET 897 is coupled to a capacitor 895, which is also coupled to node 875, which is coupled to a reference power supply (e.g., $V_{SS}$).

Figure 9A:
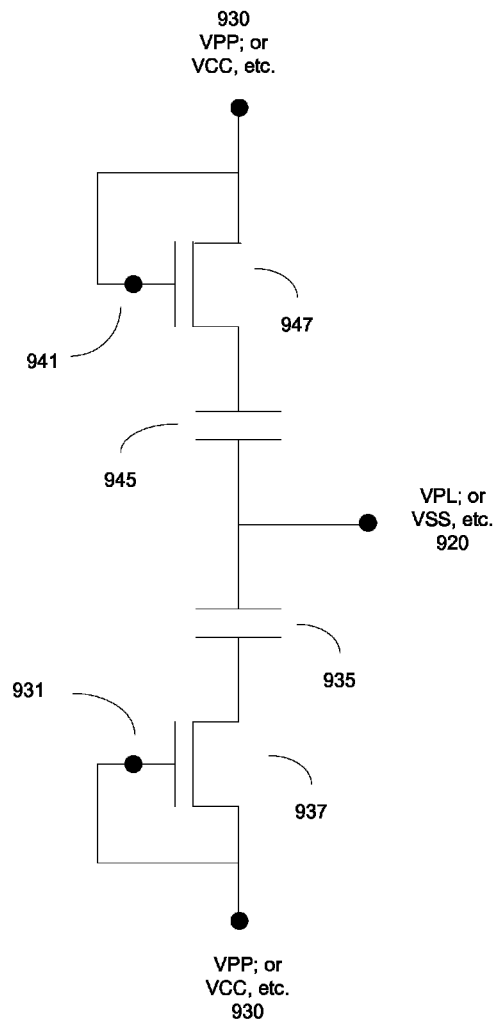
FIG. 9A is a circuit diagram of a pair of DRAM cells coupled in parallel for providing capacitance, in accordance with one embodiment of the invention.
Figure 9B:
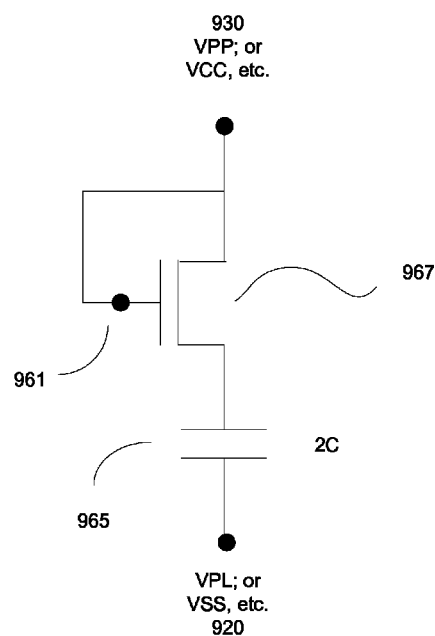
FIG. 9B is a representation of the capacitance of the configuration of a pair of DRAM cells of FIG. 9A, in accordance with one embodiment of the invention.

FIGS. 9A and 9B illustrate a pair of DRAM configured cells coupled in parallel that is repeatable to generate an array of DRAM configured cells. In particular, FIG. 9A is a diagram of a circuit 900A including of a pair of DRAM cells coupled in parallel for providing a capacitance filter for filtering a power supply, in accordance with one embodiment of the invention. The pair of DRAM cell configurations is coupled across nodes 930 and 920, wherein node 930 is coupled to a power supply (e.g., $V_{PP}$, $V_{CC}$, etc.) and node 920 is coupled to a reference power supply (e.g., $V_{PL}$, $V_{SS}$, etc.). An array of DRAM configured cells may be produced by attaching N number of DRAM cell configurations in parallel to the power supply and the reference power supply.

In particular, in the first DRAM cell configuration, the source of MOSFET 947 is coupled to node 930, which is coupled to the power supply (e.g., $V_{PP}$, $V_{CC}$, etc.). Node 930 may also be accessed for the filtered power supply. The gate of MOSFET 947 is coupled to node 941, which is also coupled to node 930 in a feedback circuit. The drain of MOSFET 947 is coupled to a capacitor 945, which is also coupled to node 920, which is coupled to the reference power supply (e.g., $V_{PL}$, $V_{SS}$, etc.). In addition, in the second DRAM cell configuration of FIG. 9A, the source of MOSFET 937 is also coupled to node 930, which is coupled to the power supply (e.g., $V_{PP}$, $V_{CC}$, etc.). The gate of MOSFET 937 is coupled to node 931, which is also coupled to node 930 in a feedback circuit. The drain of MOSFET 937 is coupled to a capacitor 935, which is also coupled to node 920, which is coupled to the reference power supply (e.g., $V_{PL}$, $V_{SS}$, etc.).

FIG. 9B is a representative circuit 900B that illustrates the total capacitance of the configuration of the pair of DRAM configured cells of FIG. 9A, in accordance with one embodiment of the invention. Because the pair of DRAM cells is coupled in parallel, the total capacitance of the circuit in 900A, as shown in representative circuit 900B, is 2C, or twice the capacitance C of each DRAM configured cell. As shown, the representative circuit 900B includes a representative MOSFET 967 and representative capacitor 965, wherein the source of MOSFET 967 is coupled to node 930, which is coupled to the power supply (e.g., $V_{PP}$, $V_{CC}$, etc.). The gate of MOSFET 967 is coupled to node 961, which is also coupled to node 930 in a feedback circuit. The drain of MOSFET 967 is coupled to the representative capacitor 965, which is also coupled to ground, or the reference power supply (e.g., $V_{PL}$, $V_{SS}$, etc.).

Figure 9C:
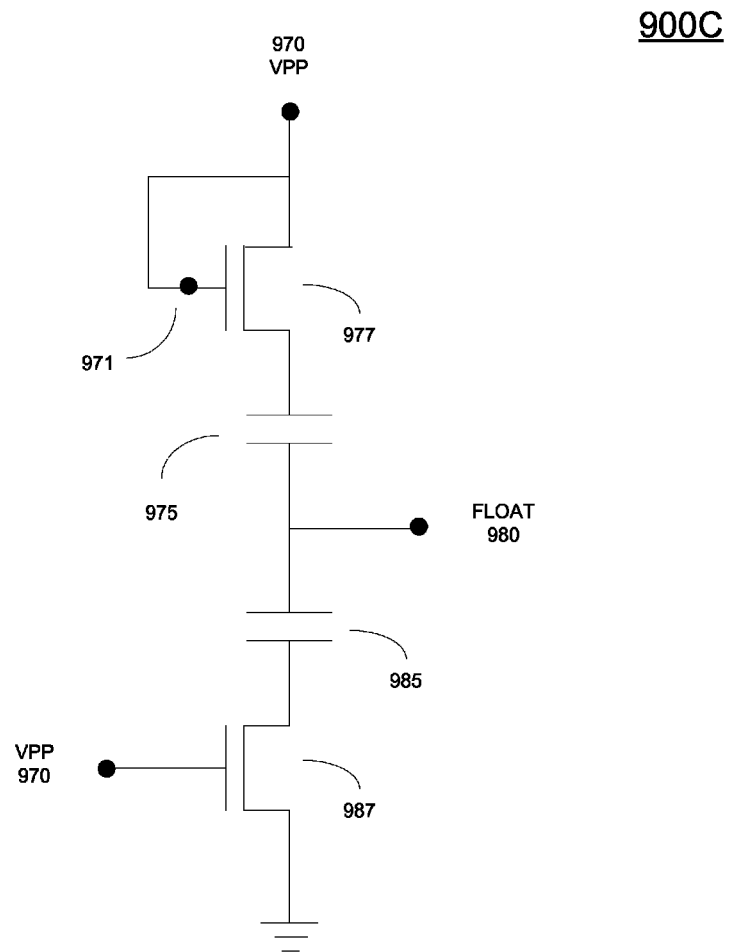
FIG. 9C is a circuit diagram of a pair of DRAM cells coupled in series for providing cap, in accordance with one embodiment of the invention.
Figure 9D:
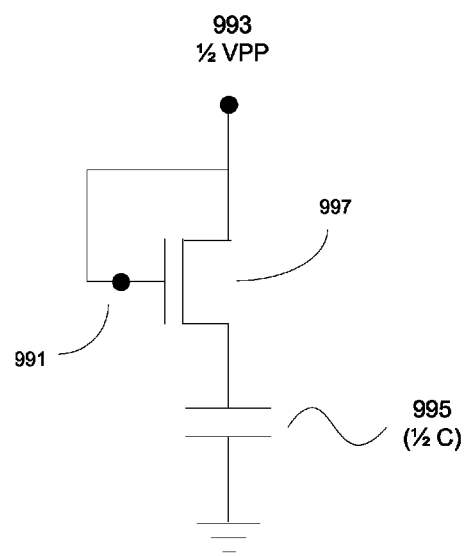
FIG. 9D is a representation of the capacitance of the configuration of the pair of DRAM cells of FIG. 9C, in accordance with one embodiment of the invention.

FIGS. 9C and 9D illustrate a pair of DRAM configured cells coupled in series that is repeatable to generate an array of DRAM configured cells. In particular, FIG. 9C is a diagram of a circuit 900C including of a pair of DRAM cells coupled in series for providing a capacitance filter for filtering a power supply, in accordance with one embodiment of the invention. In particular, a pair of DRAM cell configurations is coupled across nodes 970 and ground, wherein node 970 is coupled to a power supply (e.g., $V_{PP}$). The paired configuration in FIG. 9C may be repeated to produce an array of DRAM configured cells comprising at least one pair of DRAM cells configured for electrical coupling in series with other pairs of DRAM cell configurations between a power supply, a reference power supply, and ground. That is, the array of DRAM configured cells includes pairs of DRAM cells (coupled in series) that are configured for electrical coupling in parallel to the power supply and the reference power supply.

In particular, in the first DRAM cell configuration, the source of MOSFET 977 is coupled to node 970, which is coupled to a power supply (e.g., $V_{PP}$). Node 970 may also be accessed for the filtered power supply. The gate of MOSFET 977 is coupled to node 971, which is also coupled to node 970 in a feedback circuit. The drain of MOSFET 977 is coupled to a capacitor 975, which is also coupled to node 980, which is left floating. In addition, in the second DRAM cell configuration of FIG. 9C, node 980 is also coupled to capacitor 985, which is also coupled to the source of MOSFET 987. The gate of MOSFET 987 is coupled to node 970, which is coupled to the power supply (e.g., $V_{PP}$). The drain of MOSFET 987 is coupled to ground.

FIG. 9D is a representative circuit 900D that illustrates the total capacitance of the configuration of the pair of DRAM configured cells of FIG. 9C, in accordance with one embodiment of the invention. Because the pair of DRAM cells is coupled in series, the total capacitance of the circuit in 900C, as shown in representative circuit 900D, is one-half C, or half the capacitance C of each DRAM configured cell. As shown, the representative circuit 900D includes a representative MOSFET 997 and representative capacitor 995, wherein the source of MOSFET 997 is coupled to node 993, which is coupled to a representative power supply, which is one-half the original power supply (e.g., ½ $V_{PP}$). The gate of MOSFET 997 is coupled to node 991, which is also coupled to node 93 in a feedback circuit. The drain of MOSFET 997 is coupled to the representative capacitor 995, which is also coupled to ground.

Figure 10:
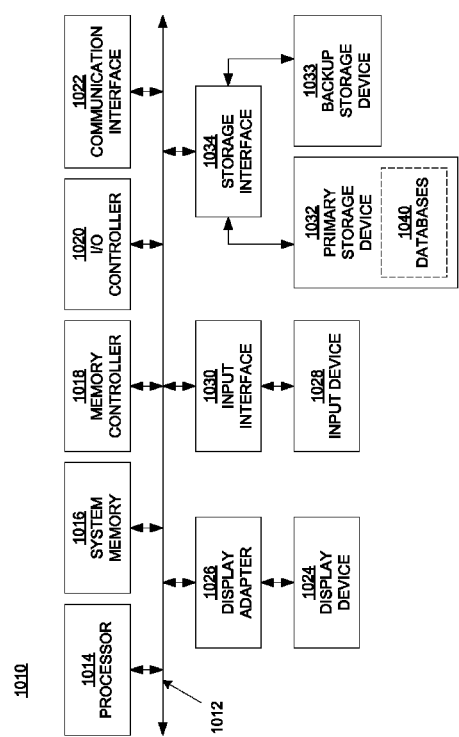
FIG. 10 depicts a block diagram of an exemplary computer system suitable for implementing the present methods and systems, in accordance with one embodiment of the invention.

FIG. 10 is a block diagram of an exemplary computing system 1010 capable of implementing embodiments of the present disclosure. Computing system 1010 broadly represents any single or multi-processor computing device or system capable of executing computer-readable instructions, and including packaged components (e.g., processor 1014, memory 1016, memory controller 1018, etc.) having a capacitance layer configured to provide a filtered power supply. Examples of computing system 1010 include, without limitation, workstations, laptops, client-side terminals, servers, distributed computing systems, handheld devices, or any other computing system or device. In its most basic configuration, computing system 1010 may include at least one processor 1014 and a system memory 1016.

Processor 1014 generally represents any type or form of processing unit capable of processing data or interpreting and executing instructions. In certain embodiments, processor 1014 may receive instructions from a software application or module. These instructions may cause processor 1014 to perform the functions of one or more of the example embodiments described and/or illustrated herein. For example, processor 1014 may perform and/or be a means for performing, either alone or in combination with other elements, one or more of the identifying, determining, using, implementing, translating, tracking, receiving, moving, and providing described herein. Processor 1014 may also perform and/or be a means for performing any other steps, methods, or processes described and/or illustrated herein.

System memory 1016 generally represents any type or form of volatile or non-volatile storage device or medium capable of storing data and/or other computer-readable instructions. Additionally, memory 1016 may be representative of a stack of memory chips within one or more packaged devices. Examples of system memory 1016 include, without limitation, RAM, DRAM, ROM, flash memory, or any other suitable memory device. Although not required, in certain embodiments computing system 1010 may include both a volatile memory unit (such as, for example, system memory 1016) and a non-volatile storage device (such as, for example, primary storage device 1032).

Computing system 1010 may also include one or more components or elements in addition to processor 1014 and system memory 1016. For example, in the embodiment of FIG. 10, computing system 1010 includes a memory controller 1018, an input/output (I/O) controller 1020, and a communication interface 1022, each of which may be interconnected via a communication infrastructure 1012. Communication infrastructure 1012 generally represents any type or form of infrastructure capable of facilitating communication between one or more components of a computing device. Examples of communication infrastructure 1012 include, without limitation, a communication bus (such as an Industry Standard Architecture (ISA), Peripheral Component Interconnect (PCI), PCI Express (PCIe), or similar bus) and a network.

Memory controller 1018 generally represents any type or form of device capable of handling memory or data or controlling communication between one or more components of computing system 1010. For example, memory controller 1018 may control communication between processor 1014, system memory 1016, and I/O controller 1020 via communication infrastructure 1012. Memory controller may perform and/or be a means for performing, either alone or in combination with other elements, one or more of the operations or features described herein.

I/O controller 1020 generally represents any type or form of module capable of coordinating and/or controlling the input and output functions of a computing device. For example, I/O controller 1020 may control or facilitate transfer of data between one or more elements of computing system 1010, such as processor 1014, system memory 1016, communication interface 1022, display adapter 1026, input interface 1030, and storage interface 1034. I/O controller 1020 may be used, for example, to perform and/or be a means for performing, either alone or in combination with other elements, one or more of the operations described herein. I/O controller 1020 may also be used to perform and/or be a means for performing other operations and features set forth in the instant disclosure.

Communication interface 1022 broadly represents any type or form of communication device or adapter capable of facilitating communication between example computing system 1010 and one or more additional devices. For example, communication interface 1022 may facilitate communication between computing system 1010 and a private or public network including additional computing systems. Examples of communication interface 1022 include, without limitation, a wired network interface (such as a network interface card), a wireless network interface (such as a wireless network interface card), a modem, and any other suitable interface. In one embodiment, communication interface 1022 provides a direct connection to a remote server via a direct link to a network, such as the Internet. Communication interface 1022 may also indirectly provide such a connection through, for example, a local area network (such as an Ethernet network), a personal area network, a telephone or cable network, a cellular telephone connection, a satellite data connection, or any other suitable connection.

Communication interface 1022 may also represent a host adapter configured to facilitate communication between computing system 1010 and one or more additional network or storage devices via an external bus or communications channel. Communication interface 1022 may also allow computing system 1010 to engage in distributed or remote computing. For example, communication interface 1022 may receive instructions from a remote device or send instructions to a remote device for execution. Communication interface 1022 may perform and/or be a means for performing, either alone or in combination with other elements, one or more of the operations disclosed herein. Communication interface 1022 may also be used to perform and/or be a means for performing other operations and features set forth in the instant disclosure.

As illustrated in FIG. 10, computing system 1010 may also include at least one display device 1024 coupled to communication infrastructure 1012 via a display adapter 1026. Display device 1024 generally represents any type or form of device capable of visually displaying information forwarded by display adapter 1026. Similarly, display adapter 1026 generally represents any type or form of device configured to forward graphics, text, and other data from communication infrastructure 1012 (or from a frame buffer, as known in the art) for display on display device 1024.

As illustrated in FIG. 10, computing system 1010 may also include at least one input device 1028 coupled to communication infrastructure 1012 via an input interface 1030. Input device 1028 generally represents any type or form of input device capable of providing input, either computer- or human-generated, to computing system 1010. Examples of input device 1028 include, without limitation, a keyboard, a pointing device, a speech recognition device, or any other input device. In one embodiment, input device 1028 may perform and/or be a means for performing, either alone or in combination with other elements, one or more of the operations disclosed herein. Input device 1028 may also be used to perform and/or be a means for performing other operations and features set forth in the instant disclosure.

As illustrated in FIG. 10, computing system 1010 may also include a primary storage device 1032 and a backup storage device 1033 coupled to communication infrastructure 1012 via a storage interface 1034. Storage devices 1032 and 1033 generally represent any type or form of storage device or medium capable of storing data and/or other computer-readable instructions. For example, storage devices 1032 and 1033 may be a magnetic disk drive (e.g., a so-called hard drive), a floppy disk drive, a magnetic tape drive, an optical disk drive, a flash drive, or the like. Storage interface 1034 generally represents any type or form of interface or device for transferring data between storage devices 1032 and 1033 and other components of computing system 1010.

In one example, databases 1040 may be stored in primary storage device 1032. Databases 1040 may represent portions of a single database or computing device or a plurality of databases or computing devices. For example, databases 1040 may represent (be stored on) a portion of computing system 1010 and/or portions of example network architecture 200 in FIG. 2 (below). Alternatively, databases 1040 may represent (be stored on) one or more physically separate devices capable of being accessed by a computing device, such as computing system 1010 and/or portions of network architecture 200.

Continuing with reference to FIG. 10, storage devices 1032 and 1033 may be configured to read from and/or write to a removable storage unit configured to store computer software, data, or other computer-readable information. Examples of suitable removable storage units include, without limitation, a floppy disk, a magnetic tape, an optical disk, a flash memory device, or the like. Storage devices 1032 and 1033 may also include other similar structures or devices for allowing computer software, data, or other computer-readable instructions to be loaded into computing system 1010. For example, storage devices 1032 and 1033 may be configured to read and write software, data, or other computer-readable information. Storage devices 1032 and 1033 may also be a part of computing system 1010 or may be separate devices accessed through other interface systems.

Storage devices 1032 and 1033 may be used to perform, and/or be a means for performing, either alone or in combination with other elements, one or more of the operations disclosed herein. Storage devices 1032 and 1033 may also be used to perform, and/or be a means for performing, other operations and features set forth in the instant disclosure.

Many other devices or subsystems may be connected to computing system 1010. Conversely, all of the components and devices illustrated in FIG. 10 need not be present to practice the embodiments described herein. The devices and subsystems referenced above may also be interconnected in different ways from that shown in FIG. 10. Computing system 1010 may also employ any number of software, firmware, and/or hardware configurations. For example, the example embodiments disclosed herein may be encoded as a computer program (also referred to as computer software, software applications, computer-readable instructions, or computer control logic) on a computer-readable medium.

The computer-readable medium containing the computer program may be loaded into computing system 1010. All or a portion of the computer program stored on the computer-readable medium may then be stored in system memory 1016 and/or various portions of storage devices 1032 and 1033. When executed by processor 1014, a computer program loaded into computing system 1010 may cause processor 1014 to perform and/or be a means for performing the functions of the example embodiments described and/or illustrated herein. Additionally or alternatively, the example embodiments described and/or illustrated herein may be implemented in firmware and/or hardware. For example, computing system 1010 may be configured as an application specific integrated circuit (ASIC) adapted to implement one or more of the embodiments disclosed herein.

Thus, according to embodiments of the present disclosure, devices and methods for filtering power supplied available to a multi-stack packaged device is achieved through a capacitance layer available within the packaged device. By placing that capacitance layer within a packaged device and as close as possible to respective active semiconductor devices, optimum power supply integrity is achieved.

While the foregoing disclosure sets forth various embodiments using specific block diagrams, flow charts, and examples, each block diagram component, flow chart step, operation, and/or component described and/or illustrated herein may be implemented, individually and/or collectively. In addition, any disclosure of components contained within other components should be considered as examples because many other architectures can be implemented to achieve the same functionality.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

The invention claimed is:
1. A multi-chip packaged device, comprising:
a capacitance layer configured for electrical coupling to a power supply and to a reference power supply, wherein said capacitance layer is configured for filtering said power supply and providing a filtered power supply;
a first semiconductor layer including a logic device configured for electrical coupling to said filtered power supply; and
a second semiconductor layer including a memory device electrically coupled to said first semiconductor layer.

2. The packaged device of claim 1, wherein said capacitance layer is formed adjacent to said first semiconductor layer including said logic device.

3. The packaged device of claim 1, wherein said memory device comprises at least one dynamic random-access memory (DRAM) cell.

4. The packaged device of claim 1, wherein said memory device comprises at least one flash memory cell.

5. The packaged device of claim 1, wherein said second semiconductor layer is formed over said capacitance layer, such that said capacitance layer is between said first semiconductor layer and said second semiconductor layer.

6. The packaged device of claim 1, wherein said second semiconductor layer is formed over said capacitance layer, such that said first semiconductor layer is formed between said capacitance layer and said second semiconductor layer.

7. The packaged device of claim 1, wherein said second semiconductor layer is formed over said capacitance layer, such that said second semiconductor layer is formed between said capacitance layer and said first semiconductor layer.

8. The packaged device of claim 1, further comprising:
a second capacitance layer configured for electrical coupling to said power supply and to said reference power supply, wherein said second capacitance layer is configured for filtering said power supply and providing a second filtered power supply.

9. A multi-chip packaged device, comprising:
a capacitance layer configured for electrical coupling to a power supply and to a reference power supply, wherein said capacitance layer is configured for filtering said power supply and providing a filtered power supply; and
a first semiconductor layer including a logic device configured for electrical coupling to said filtered power supply;
wherein said capacitance layer comprises a semiconductor layer.

10. The packaged device of claim 9, wherein said capacitance layer comprises:
an array of DRAM configured cells, wherein said DRAM configured cells are configured for electrical coupling in parallel to said power supply and said reference power supply.

11. The packaged device of claim 9, wherein said capacitance layer comprises:
an array of DRAM configured cells comprising at least one pair of DRAM cells configured for electrical coupling in series between said power supply and said reference power supply, such that pairs of DRAM cells are configured for electrically coupling in parallel to said power supply and said reference power supply.

12. A multi-chip packaged device, comprising:
a first power supply;
a first reference power supply;
a capacitance layer comprising a plurality of portions of capacitance areas, each of which is electrically isolated from other portions;
a first portion of said capacitance layer that is electrically coupled to said first power supply and to said first reference power supply to provide a filtered first power supply;
a first semiconductor layer including a logic device electrically coupled to said filtered first power supply;
a second power supply;
a second reference power supply; and
a second portion of said capacitance layer that is electrically coupled to said second power supply and to said second reference power supply to provide a filtered second power supply, wherein said first semiconductor layer is electrically coupled to said filtered second power supply.

13. The packaged device of claim 12, wherein said capacitance layer is formed adjacent to said first semiconductor layer including said logic device.

14. A multi-chip packaged device, comprising:
a first power supply;
a first reference power supply;
a capacitance layer comprising a plurality of portions of capacitance areas, each of which is electrically isolated from other portions;
a first portion of said capacitance layer that is electrically coupled to said first power supply and to said first reference power supply to provide a filtered first power supply;
a first semiconductor layer including a logic device electrically coupled to said filtered first power supply; and
a second semiconductor layer including a memory device electrically coupled to said first semiconductor layer, wherein said second semiconductor layer is formed over said capacitance layer, such that said capacitance layer is between said first semiconductor layer and said second semiconductor layer.

15. A multi-chip packaged device, comprising:
a first power supply;
a first reference power supply;
a capacitance layer comprising a plurality of portions of capacitance areas, each of which is electrically isolated from other portions;
a first portion of said capacitance layer that is electrically coupled to said first power supply and to said first reference power supply to provide a filtered first power supply; and
a first semiconductor layer including a logic device electrically coupled to said filtered first power supply;
wherein said first portion of said capacitance layer comprises an array of DRAM configured cells, wherein said DRAM configured cells are electrically coupled in parallel to said first power supply and said first reference power supply.

16. A multi-chip packaged device, comprising:
a first power supply;
a first reference power supply;
a capacitance layer comprising a plurality of portions of capacitance areas, each of which is electrically isolated from other portions;
a first portion of said capacitance layer that is electrically coupled to said first power supply and to said first reference power supply to provide a filtered first power supply; and
a first semiconductor layer including a logic device electrically coupled to said filtered first power supply;
wherein said first portion of said capacitance layer comprises an array of DRAM configured cells comprising at least one pair of DRAM cells electrically coupled in series between said first power supply and said first reference power supply, such that pairs of DRAM cells are electrically coupled in parallel to said first power supply and said first reference power supply.

17. The packaged device of claim 12, wherein said logic device comprises a memory controller.

18. The packaged device of claim 12, wherein said logic device comprises a microprocessor.

19. A method for packaging, comprising:
forming a capacitance layer configured for electrical coupling to a power supply and to a reference power supply, wherein said capacitance layer is configured for filtering said power supply and providing a filtered power supply;

forming a first semiconductor layer including a logic device configured for electrical coupling to said filtered power supply; and forming a second semiconductor layer including a memory device electrically coupled to said first semiconductor layer, wherein said second semiconductor layer is formed over said capacitance layer, such that said capacitance layer is between said first semiconductor layer and said second semiconductor layer.

20. the method of claim 19, further comprising:

forming said capacitance layer adjacent to said first semiconductor layer including said logic device.

21. A method for packaging, comprising:

forming a capacitance layer configured for electrical coupling to a power supply and to a reference power supply, wherein said capacitance layer is configured for filtering said power supply and providing a filtered power supply;

forming a first semiconductor layer including a logic device configured for electrical coupling to said filtered power supply; and forming a second semiconductor layer including a memory device electrically coupled to said first semiconductor layer, wherein said second semiconductor layer is formed over said capacitance layer, such that said first semiconductor layer is formed between said capacitance layer and said second semiconductor layer.

22. The method of claim 21, wherein said forming a capacitance layer comprises:

forming an array of DRAM configured cells on said second semiconductor layer, wherein said DRAM configured cells are configured for electrical coupling in parallel to said power supply and said reference power supply.

23. The method of claim 21, wherein said forming a capacitance layer comprises:

forming an array of DRAM configured cells on said second semiconductor layer, wherein said array comprises at least one pair of DRAM cells configured for electrical coupling in series between said power supply and said reference power supply, such that pairs of DRAM cells are configured for electrically coupling in parallel to said power supply and said reference power supply.

\* \* \* \* \*